6-45
/14/87 RE 32,401

United States Patent [19]
Beilstein, Jr. et al.

[11] E Patent Number: Re. 32,401
[45] Reissued Date of Patent: Apr. 14, 1987

[54] QUATERNARY FET READ ONLY MEMORY

[75] Inventors: Kenneth E. Beilstein, Jr.; Harish N. Kotecha, both of Essex Junction, Vt.

[73] Assignee: International Business Machines Corporation, Armonk, N.Y.

[21] Appl. No.: 238,872

[22] Filed: Feb. 27, 1981

Related U.S. Patent Documents

Reissue of:
[64] Patent No.: 4,202,044
Issued: May 6, 1980
Appl. No.: 915,338
Filed: Jun. 13, 1978

[51] Int. Cl.[4] ..... G11C 11/40
[52] U.S. Cl. ..... 365/182; 365/194; 365/178; 365/45; 365/168; 357/23.12
[58] Field of Search ..... 357/23.4, 23.5, 23.12; 365/184, 103, 104, 178, 182, 184, 45, 168, 279

[56] References Cited

U.S. PATENT DOCUMENTS

| | | | |
|---|---|---|---|
| 3,623,023 | 11/1971 | Olekstak | 365/174 |
| 3,909,806 | 9/1975 | Uchida | 365/45 |
| 4,054,864 | 10/1977 | Audaire | 365/45 |
| 4,142,176 | 2/1979 | Dozier | 365/174 |
| 4,192,014 | 3/1980 | Claycraft | 365/104 |
| 4,272,830 | 6/1981 | Moench | 365/45 |

OTHER PUBLICATIONS

IBM TDB, Oct. 1974, p. 1356, "Multiple Threshold IGFET Ternary Circuits by A. H. Dansky, vol. 17, No. 5.

*Primary Examiner*—Terrell W. Fears
*Attorney, Agent, or Firm*—John E. Hoel

[57] ABSTRACT

A quaternary FET read only memory is disclosed wherein each FET storage element in the array has its threshold adjusted by ion-implantation to one of four values. Each FET element in the array has its drain connected to a drain potential $V_{DD}$. A binary input signal from a conventional binary, true/complement generator will then enable the gate of a selected FET storage cell and the output potential at the source of that selected storage cell will be $V_{DD}$ minus the customized threshold voltage of that storage cell, which is output at an output node. The signal on the output node is a quaternary signal which may be amplified by a quaternary sense amplifier circuit and then converted from quaternary to binary signal by means of a converter. The quaternary read only memory is capable of storing twice as much information per unit area as is a conventional FET binary read only memory. The concept may be expanded to N levels of information storage, using FET array devices with N different threshold voltages.

19 Claims, 12 Drawing Figures

QUATERNARY FET READ ONLY MEMORY

Matter enclosed in heavy brackets [ ] appears in the original patent but forms no part of this reissue specification; matter printed in italics indicates the additions made by reissue.

FIELD OF THE INVENTION

The invention disclosed broadly relates to memory circuits and more particularly relates to FET memory circuits.

BACKGROUND OF THE INVENTION

FET memory technology has been devoted in the prior art to the storage of binary electric signals, as is disclosed, for example, in U.S. Pat. No. 3,728,696 to Polkinghorn. In the prior art binary FET read only memory, a plurality of address input lines and selection lines form a matrix with regions of a semiconductor substrate. Binary information is stored at locations between adjacent semiconductor regions by the presenc- or absence of field effect transistors at that location. Alternate semiconductor regions are selectively connected to a voltage reference and the remaining regions in between are selectively connected to a common output point by means of selection field effect transistors in series with each region. Selection signals applied to the selection transistors of an adjacent pair of regions connect one region to the voltage reference and the other region to output to provide a binary output signal which is a function of the data stored at a particular addressed storage location.

The direction of evolution for the semiconductor storage device technology has been to increase the number of storage devices per unit area on the semiconductor chip. This increases the storage capacity with respect to the cost of manufacture of the semiconductor memory.

In the course of the evolution of the semiconductor industry, the technique of ion-implantation into the channel region of an FET device has been developed to adjust the threshold voltage for the FET device so that the gate voltage at which the device will switch on can be customized in accordance with the application at hand. Techniques for accomplishing this have been disclosed in U.S. Pat. No. 3,873,372 to Johnson. In the case of an N-channel FET device, where the source and drain of N-type conductivity are formed in a substrate of P-type conductivity, the threshold voltage of the FET device may be increased by ion-implanting additional P-type conductivity dopants into the channel region. Alternately, the threshold voltage of the FET device may be reduced by ion-implanting N-type conductivity dopants into the channel region. The degree of change of the threshold voltage during ion-implantation is in approximate proportion to the dosage of the ion-implantation dopant in the channel region. This threshold voltage may be adjusted by controlling the ion-implantation beam current or the time of exposure to the ion beam, as well as by other processing factors.

In the prior art, support circuitry for a binary FET read only memory (ROM) has employed basic FET inverter circuits such as is described in U.S. Pat. No. 3,406,298 to Axelrod. Other types of prior art inverter circuits which can be employed in the support circuitry for the prior art binary read only memories is discussed in U.S. Pat. No. 4,072,868 by H. N. Kotecha, et al.

OBJECTS OF THE INVENTION

It is therefore an object of the invention to increase the storage capacity per unit area for a semiconductor storage device.

It is yet another object of the invention to provide an increase in the storage density without a corresponding increase in the number of storage devices in a semiconductor memory.

It is still a further object of the invention to provide an improved read only memory system.

SUMMARY OF THE INVENTION

These and other objects, features and advantages of the invention are accomplished by the quaternary read only memory disclosed herein.

The quaternary FET read only memory has each FET storage element in its array formed with a customized threshold voltage having one of four values. The threshold voltage for the FET devices in the array is adjusted at the time of manufacture by the ion-implantation technique. Each FET element in the array has its drain connected to a drain potential $V_{DD}$. A binary input address signal from a conventional binary true/-complement generator then enables the gate of a selected FET storage cell in the array and the output potential at the source of that FET storage cell becomes the $V_{DD}$ voltage minus the customized threshold voltage for that cell. This resultant output voltage is a quaternary signal, that is, it can assume one of four voltage magnitudes. This quaternary output signal may be amplified by a quaternary sense amplifier circuit disclosed herein, and then converted from the quaternary signal to a binary signal by means of a quaternary-to-binary converter, also disclosed herein. The resultant quaternary FET read only memory is capable of storing twice as much information per unit area as is a conventional binary read only memory having the same number of storage devices per unit area on the semiconductor chip. The concept may be expanded to N levels of information storage, using FET array devices with N different threshold voltages.

DESCRIPTION OF THE FIGURES

These and other objects, features and advantages of the invention can be more fully appreciated with reference to the accompanying figures.

FIG. 7 is a schematic diagram of the sense amplifier circuit 12 of FIG. 5 showing the current flow for the condition where devices T1 and T2 are on.

DISCUSSION OF THE PREFERRED EMBODIMENT

Figure 1:
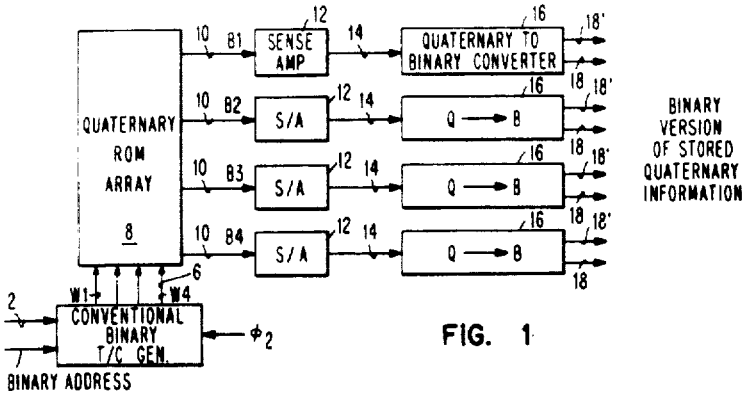
FIG. 1 is a functional block diagram of the quaternary read only memory system showing how the quaternary read only memory array is connected to the sense amplifier and quaternary-to-binary converter circuits.

The quaternary read only memory system shown in FIG. 1 has binary address signal input on line 2 to a conventional binary true/complement generator. The binary output signals from the true/complement generator 4 are output over the lines 6 labeled "W1–W4" and will be called the word lines. The word lines 6 enable the gate electrodes of the FET storage elements Q11–Q44 of FIG. 2.

Figure 2:
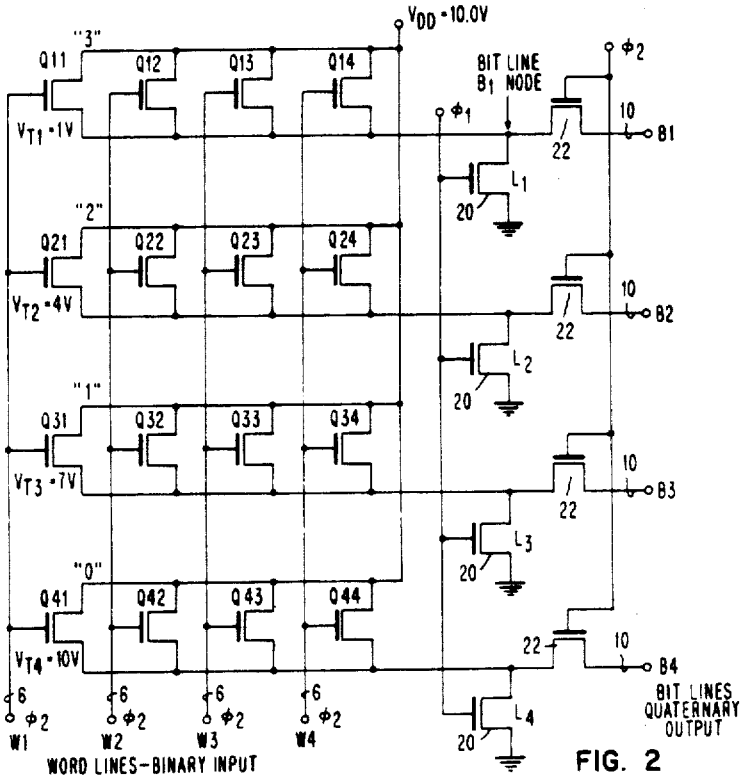
FIG. 2 is a schematic diagram illustrating a portion of the quaternary read only memory array 8 showing the binary input on the word lines and the quaternary output on the bit lines.

FIG. 2 is a schematic electric circuit diagram of a portion of the array 8 of FIG. 1 for the quaternary read only memory. Horizontal rows of FET read only storage elements are arranged on the memory chip with their drains connected to a drain potential $V_{DD}$ and their sources commonly connected to an output bit line 10. The plurality of rows of array devices are arranged on the memory chip so that array devices which are juxtaposed in columns have their gates commonly connected to a binary input word line 6. Each bit line 10 has a discharge load device 20 connected between it and ground potential, with all of the load devices 20 having their gates commonly connected to a first clock phase signal $\phi_1$. Each of the bit lines 10 also has an output gating device 22 connected in series between the corresponding discharge load device 20 and the output node.

For purposes of illustration, the array shown in FIG. 2 is organized into four words W1–W4, each of which contains four bits. An array storage device is labeled with the matrix notation $Q_{ij}$ where i is the number of the row and j is the number of the column in the array, as shown in FIG. 2.

During the manufacture of the read only memory array 8 of FIG. 2, each of the FET storage elements $Q_{ij}$ in the array is selectively ion-implanted in its channel region with one of four doses of conductivity enhancing dopant so as to achieve one of four predetermined threshold voltages for the ion-implanted device. Three ion-implantations may be carried out and the inherent threshold for an unimplanted channel may serve as the fourth customized threshold voltage. The ion-implantation may be of either conductivity type so that, for example, where all of the FET devices in the array 8 are N-channel devices, some of the devices could be selectively implanted with a P-type dopant to raise the threshold voltage for the implanted device while other devices could be implanted with an N-type dopant to reduce the threshold voltage of the implanted device. This selective ion-implantation of the array 8 in FIG. 2 may be carried out, for example, by using three ion-implantation blocking masks composed of conventional photoresist. The first blocking mask would prevent ion-implantation in all but a first group of selected array devices to achieve a first threshold voltage. A second ion-implantation blocking mask can then block all but a second group of selected FET devices to achieve a second threshold voltage, and so on until four groups of FET devices have been fabricated with four different threshold voltages. The pattern of selection of the threshold voltages for the FET storage devices in the array 8 of FIG. 2 corresponds with the information which is to be permanently stored in the read only memory. The concept may be expanded to N levels of information storage, using FET array devices with N different threshold voltages. The threshold voltage can also be adjusted by varying the gate oxide thickness and, for the largest threshold voltages desired, may be established by leaving the thick, field insulator layer over the FET channel region.

In operation the array 8 has a first phase clock signal $\phi_1$ which turns on the discharge load devices 20 for each of the bit lines 10, discharging any residual charge on the bit lines 10. The $\phi_1$ signal then turns off the discharge load devices 20 and the $\phi_2$ clocking signal turns on the FET gating devices 22 in each of the bit lines 10 and enables one of the word lines 6 through the conventional binary true/complement generator, corresponding to the binary input address 2. The voltage magnitude of the $\phi_2$ clocking pulse which is applied over the word line 6 to the gate of the array device is as least as large as the voltage $V_{DD}$ applied to the drain of the array device so that even those array devices having the highest customized threshold voltage will be turned on when selected. An array device $Q_{ij}$ is turned on by the application of the $\phi_2$ clocking signal to the word lines $W_j$ and drives the voltage on the bit line 10 to which it is connected up to a magnitude approximately equal to the gate voltage $V_{DD}$ minus the customized threshold voltage of the selected FET array device. Thus, the magnitude of the output signal on the bit line 10 will assume one of four values corresponding to that one of the four possible values of the customized threshold voltage with which the selected FET array device $Q_{ij}$ was manufactured. Thus, it is seen that the storage capacity of a single device $Q_{ij}$ in the array 8 of FIG. 2 is twice that of a conventional binary FET storage device in a conventional read only memory circuit. As an example, quaternary logic levels 0, 1, 2, and 3 can correspond to signal voltage levels of 0 volts, 3 volts, 6 volts and 9 volts, respectively. The drain potential $V_{DD}$ is to be 10 volts and ground potential is to be 0 volts. The $\phi_1$ and $\phi_2$ clock pulses are to swing from 0 volts to 10 volts in their transition. Let the left most column of array devices Q11, Q21, Q31 and Q41 of FIG. 2 be fabricated with ion-implanted threshold voltages of 1 volt, 4 volts, 7 volts and 10 volts, respectively. Then, when the word lines W1 carries the $\phi_2$ clock pulse signal thereon, the output signal on the corresponding bit line 10 which is the gate potential $V_{DD}$ minus the customized threshold voltage for the array device will be 9 volts for bit line 1, 6 volts for bit line 2, 3 volts for bit line 3 and 0 volts for bit line 4, corresponding to the quaternary logic levels 3, 2, 1 and 0, respectively. The array FET devices $Q_{ij}$ could have been programmed with any other pattern of threshold voltages than that given in the example and any other of the word lines $W_j$ could have carried the $\phi_2$ clock pulse signal, thereby producing a different pattern of quaternary signal outputs on the bit lines 10.

Figure 3:
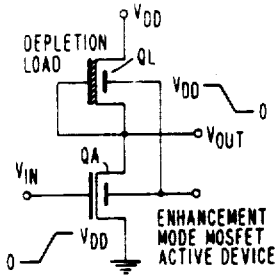
PRIOR ART FIG. 3
FIG. 3 is a schematic diagram of the prior art enhance deplete inverter circuit.
Figure 4:
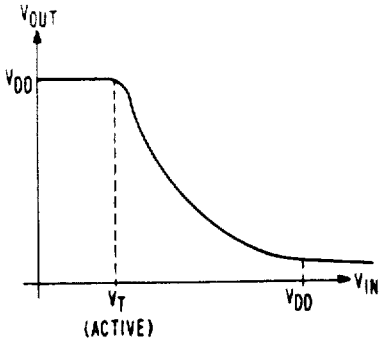
FIG. 4 is a diagram of the voltage output characteristic for the inverter circuit shown in FIG. 3.
Figure 5:
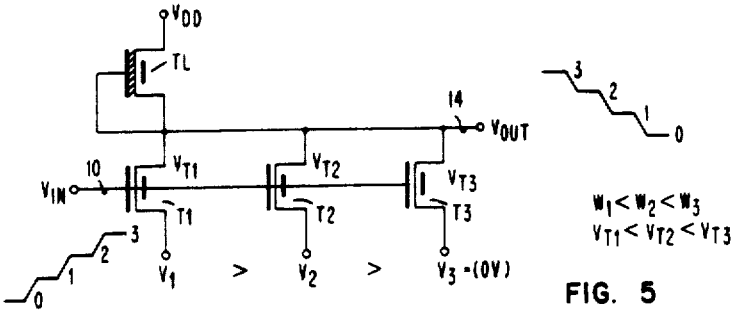
FIG. 5 is a schematic diagram of the quaternary sense amplifier circuit 12.

The bit lines 10 are each connected to a quaternary sense amplifier 12 of FIG. 1, which is shown in schematic diagram in FIG. 5. To better understand the principle of the sense amplifier circuit 12 of FIG. 5 the following discussion will consider the N-channel depletion mode load inverter circuit shown in FIG. 3 and its output voltage characteristics shown in FIG. 4. When the input voltage $V_{IN}$ is 0, the active device QA is off.

Since the depletion mode load device QL has a negative turn on voltage with its gate and source connected in common, the output voltage magnitude $V_{OUT}$ will equal the drain potential for the load device, $V_{DD}$. As $V_{IN}$ increases, $V_{OUT}$ is maintained at the drain potential $V_{DD}$ until $V_{IN}$ exceeds the turn on voltage or threshold voltage $V_T$ of the active device QA. Once this happens, the active device QA turns on and starts conducting current through the load device QL, reducing the magnitude of the output voltage $V_{OUT}$ to almost 0 volts or ground potential. The two states are defined by the output $V_{OUT}$ equals $V_{DD}$ when $V_{IN}$ is less than or equal to $V_T$ and $V_{OUT}$ being approximately equal to 0 volts and $V_{IN}$ is equal to $V_{DD}$. Note the value of the threshold voltage $V_T$ is chosen in practice to be about one volt so that a stable level is obtained even when processed tolerances cause about a 30% variation in its value. Note also that $V_{OUT}$ is clamped at the value of $V_{DD}$ until the magnitude of $V_{IN}$ exceeds this value of threshold voltage $V_T$. At the other extreme, $V_{OUT}$ is clamped at a voltage having a magnitude close to 0 volts and is less than the threshold voltage $V_T$ of the next stage active device in a cascaded series of such inverters, even when the 30% variation in $V_T$ and 10% variation in power supply of voltage $V_{DD}$ are present.

From the foregoing it should be apparent that the first level is obtained due to the requirement by the active device QA of a certain voltage magnitude for $V_{IN}$, that is, the threshold voltage $V_T$, before the active device QA turns on. Therefore, the output level $V_{OUT}$ is effectively clamped at $V_{DD}$ as long as the input voltage $V_{IN}$ is less than the threshold voltage $V_T$. On the other hand, the down level clamping of the voltage magnitude of $V_{OUT}$ is at about the voltage at which the source of the active device QA is biased.

These observations may now be applied to the analysis of the operation of the quaternary sense amplifier shown in FIG. 5.

FIG. 5 illustrates the 4-state sense amplifier circuit 12 of FIG. 1. The three active devices have a common drain and gate terminal. The threshold voltages of T1, T2 and T3 are $V_{T1}$, $V_{T2}$ and $V_{T3}$ respectively. In the same order, the sources of each of the three devices are tied to $V_1$, $V_2$, and $V_3$.

Figure 6:
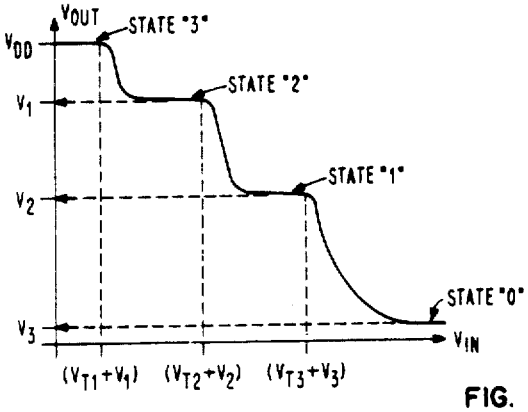
FIG. 6 is a diagram of the voltage output characteristics for the quaternary sense amplifier 12 in FIG. 5.

When $V_{IN}$ rises from 0 volts, $V_{OUT}=V_{DD}$ since:

$(V_{IN}-V_1)<V_{T1}$ or T1 is off, $(V_{IN}-V_2)<V_{T2}$ or T2 is off, $(V_{IN}-V_3)<V_{T3}$ or T3 is off, giving a stable state, say "3". As $V_{IN}$ rises so that:

$(V_{IN}-V_1)>V_{T1}$, $(V_{IN}-V_2)<V_{T2}$, and $(V_{IN}-V_3)<V_{T3}$, device T1 turns on, and $V_{OUT}$ falls to a value of about $V_1$ from $V_{DD}$, FIG. 6.

Figure 7:
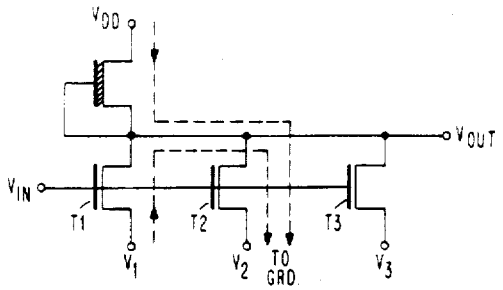

At this point, the current flows from the load depletion device to ground through T1. Further increase in $V_{IN}$ does not significantly change the value of $V_{OUT}$ from $V_1$ as long as devices T2 and T3 are off, thus maintaining the second stable state, state "2". Once $(V_{IN}-V_2)>V_{T2}$ and $(V_{IN}-V_3)<V_{T3}$, device T2 starts turning on. The output node $V_{OUT}$ is now pulled down to $V_2$. Since $V_1>V_2$, T1 is now biased in the opposite direction with roles of source and drain interchanged. The load device and device T1 then effectively act as load device for T3. The current paths for this case are illustrated in FIG. 7.

Further increases in $V_{IN}$ maintains $V_{OUT}$ at about $V_2$ or state "1" as long as:

$V_{IN}-V_3)<V_{T3}$.

Figure 8:
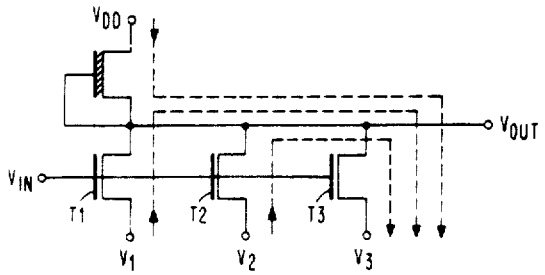
FIG. 8 is a schematic diagram of the sense amplifier circuit 12 of FIG. 5 under the circumstance that all three active devices T1, T2 and T3 are gated on, showing the current distribution therein.

Once $V_{IN}$ increases such that $(V_{IN}-V_3)$ exceeds $V_{T3}$, device T3 turns on pulling $V_{OUT}$ down to $V_3$ or 0 volts. When this occurs, $V_2>V_{OUT}$ and the device T2 conducts in the opposite direction. Alternatively, the load device T1 and T2 act as load device for T3. The current paths are indicated in FIG. 8.

$V_{OUT}$ now falls to $V_3$ or 0 volts yielding the final state "0". Note that device T1 has to sink current from only the load device. Device T2 on the other hand sinks in current from both load device and T1. T3 sinks in current from all three devices. As a result the widths for each of the devices taken in order, assuming same lengths must satisfy.

$W1<W2<W3$.

Referring back to FIG. 6, the values of $V_{T1}$, $V_{T2}$, $V_{T3}$ and $V_1$, $V_2$ and $V_3$ equal 0 are determined depending on the worse case process tolerances which give the desired stable levels.

In the standard four mask metal gate process, with an added ion-implantation mask if depletion load devices are used, the variable turn on voltages required for the proposed circuit are easily obtained by adding necessary ion-implantation masks. The type, energy and dosage of ion-implant depends on design constraints. It should be noted that from overlay considerations, ion-implant mask is noncritical since it normally is designed conservatively.

The output signal $V_{OUT}$ on line 14 from the sense amplifier 12 is applied to the quaternary-to-binary converter 16, a detailed electrical circuit schematic diagram of which is shown in FIGS. 9a–9d. The quaternary-to-binary converter 16 converts the quaternary signal input on line 14 into a first binary signal output on line 18 and a second binary signal output on line 18' having the same numerical value as the numerical value of the input quaternary signal on line 14.

In FIG. 5, as an example, let the logical states of 0, 1, 2 and 3 be represented by voltage levels of $V_3$, $V_2$, $V_1$ and $V_{DD}$ respectively such that $V_3$ is the ground potential and $V_{DD}$ equals 9 volts is the power supply of the drain of the load devices. Further, to demonstrate the concept, FIG. 5 is a quaternary inverter with load device TL and active devices T1, T2 and T3 have their sources tied to voltages $V_1$ equals 6 volts, $V_2$ equals 3 volts and $V_3$ equals 0 volts, respectively. The threshold voltages of these devices taken in order are $V_{T1}$, $V_{T2}$, and $V_{T3}$, having a numerical value of $V_{T1}$ equals −4.5 volts, $V_{T2}$ equals 1.0 volts and $V_{T3}$ equals 6.5 volts.

Assume that the quaternary bit Q for the inverter of FIG. 5 is to be converted to two equivalent binary bits A and B with binary logical representation of either 0 or 1 and corresponding voltage levels of $V_3$ $V_{DD}$.

The table shows the truth table with all possible logical values of Q and the representative logical values of binary bits A and B.

TRUTH TABLE FOR LOGICAL VALUES OF BINARY BITS A AND B

| Q | A | B | $S_0$ | $S_1$ | $S_2$ |
|---|---|---|---|---|---|
| 0 | 0 | 0 | 0 | 0 | 0 |
| 1 | 0 | 1 | 0 | 0 | 1 |
| 2 | 1 | 0 | 0 | 1 | 1 |

-continued

| TRUTH TABLE FOR LOGICAL VALUES OF BINARY BITS A AND B | | | | | |
|---|---|---|---|---|---|
| Q | A | B | $S_0$ | $S_1$ | $S_2$ |
| 3 | 1 | 1 | 1 | 1 | 1 |

Three binary variables $S_0$, $S_1$ and $S_2$ are generated such that:

$A = S_1$ $B = S_2 \cdot (\bar{S}_0\bar{S}_1 + S_0S_1)$

The logical values of these variables are indicated in the truth table above. To generate these variables properties of devices with threshold voltages corresponding to T1, T2 and T3 of FIG. 5 are used.

Figure 9A:
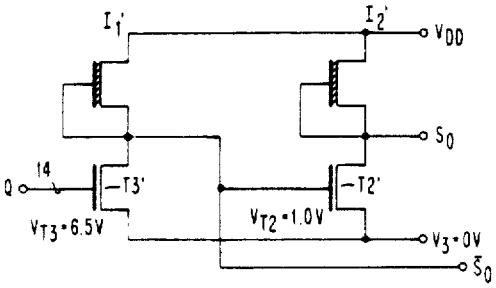
FIGS. 9a, 9b, 9c and 9d constitute the quaternary-to-binary converter 16.

Variable $S_0$ is required to have a logical value of 1 (or voltage level $V_{DD}$) only when the quaternary bit Q is at logical value 3 or voltage level $V_{DD}$, and is produced by the circuit of FIG. 9a. Since device T3' has a threshold voltage of $V_{T3}$ equals 6.5 volts, it is always in off condition for logical values of Q of 0, 1 or 2. As a result, the output of inverter $I_1'$, $\bar{S}_0$ is at logical level 1 while that of $I_2'$, $S_0$ is at logical level 0 for these values of Q. However, when Q equals the value 4 (or at voltage level $V_{DD}$), T3' turns on so that $\bar{S}_0$ equals 0 and correspondingly $S_0$ equals 1. Thus, variable $S_0$ is generated.

Figure 9B:
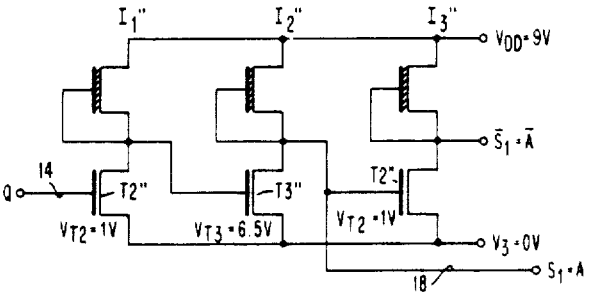
Figure 9C:
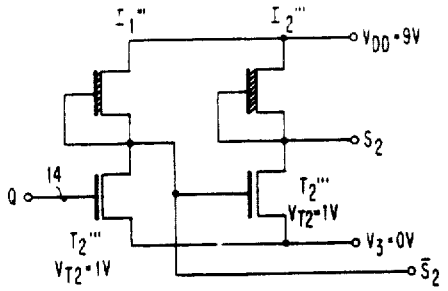

Variable $S_1$ or A is required to have a value of zero when Q equals either 0 or 1. This is achieved by using devices T2" and T3". FIG. 9b illustrates the circuit which achieves this. When Q equals 0 or 1 the input voltage to inverter $I_1''$ is either $V_3$ which equals 0 volts or $V_2$ which equals 3 volts. As a result, the output of $I_1''$ which is input to $I_2''$ is $V_{DD}$ or greater than 6.5 volts, respectively. The latter is obtained by choosing a suitable aspect ratio for inverter $I_1''$. Correspondingly $S_1$ of inverter $I_2''$ is at ground and 0 for these values of Q. Inverter $I_3''$ simply complements the output of inverter $I_2''$ yielding $\bar{S}_1$ or A at logical level 1. When Q equals 2 or 3, however, the output of inverter $I_1''$ is insufficient to turn T3" on such that $S_1$ equals 1 and $\bar{S}_1$ equals 0. In this manner the above circuit of FIG. 9b yields variable $S_1$ or the value of A for output 18.

Variable $S_2$ is required to be at logical state 0 for the value of Q equals 0 but at logical state 1 for all other values of Q. This can be simply achieved by using the circuit of FIG. 9c. Since the turn on voltage of T2''' or $V_{T2}$ equals 1 volt, T2''' of inverter $I_1'''$ is off when Q equals 0 and on when Q equals 1, 2, or 3. This results in the required output of $I_1'''$, i.e. $\bar{S}_2$ and also that of inverter $I_2'''$ which simply complements $\bar{S}_2$ to $S_2$.

Now that the three variables $S_0$, $S_1$ and $S_2$ are available the required binary bit A is equal to $S_1$ while for the binary bit B, the switching expression, as mentioned before, is:

$$B = S_2 \cdot (\bar{S}_0\bar{S}_1 + S_0S_1)$$

Figure 9D:
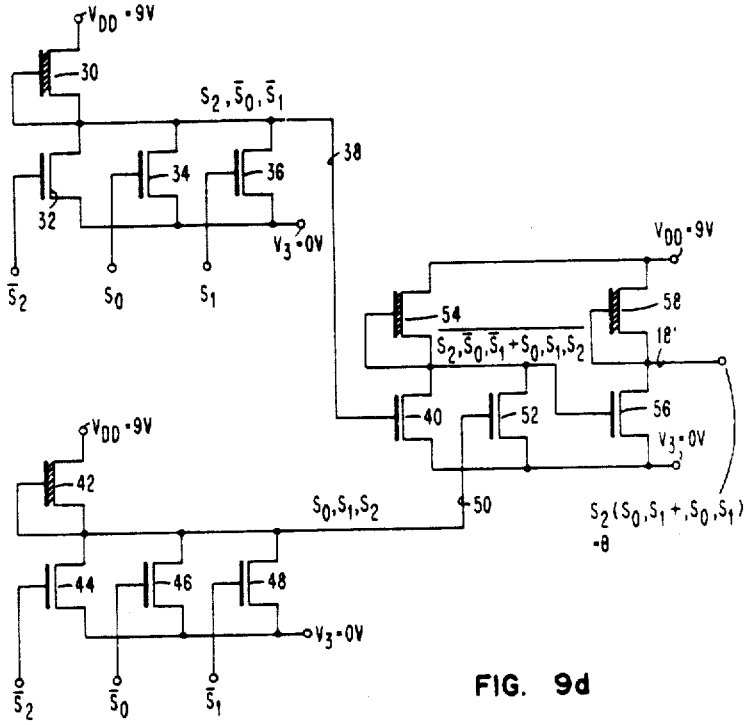

The circuit implementation of B is well-known and for the sake of completeness an example is shown in FIG. 9d. FET devices 32, 34 and 36 are connected as a NOR with load device 30, yielding the output 38. FET devices 44, 46 and 48 are connected as a NOR with load device 42, yielding the output 50. FET devices 40 and 52 with inputs 38 and 50 respectively, are connected as a NOR with load device 54, producing an output inverted by FET devices 56 and 58, yielding the desired binary bit B at 18'. If binary logical outputs A and B have a voltage level not compatible with subsequent FET circuitry, the level may be adjusted with additional inverters.

The resulting quaternary read only memory system is capable of storing twice as much information per unit area as is a conventional binary read only memory. In addition, if the quaternary read only memory array 8 is contained on a semiconductor chip which is independent of the sense amplifier circuits 12, a reduction in the number of I/O pads on the semiconductor chip is achieved, resulting in a reduction in packaging and wiring costs.

Having thus described our invention, what we claim as new, and desire to secure by Letters Patent is:

1. A multilevel read only memory, comprising: a plurality of storage FET devices arranged into rows and columns, with each device having one predefined permanent threshold voltage out of N possible threshold voltages, N being greater than 2, with each FET in said row of FET devices having its drain connected to a common drain voltage and its source connected to a common bit line output and with each FET in said column of FET devices having its gate connected to a common word line input;

whereby a binary input signal on one of said word lines generates a one-out-of N-level signal on each of said bit lines.

2. A multilevel read only memory, comprising:

a plurality of storage FET devices arranged into rows and columns, with each device having one predefined threshold voltage out of N possible threshold voltages, with each FET in said row of FET devices having its drain connected to a common drain voltage and its source connected to a common bit line output and with each FET in said column of FET devices having its gate connected to a common word line input;

a discharge switching FET device connected between said bit line and ground potential, having an input gate connected to a first phase clock waveform for dissipating residual electric charge on said bit line during a first phase;

whereby a binary input signal on one of said word lines generates a one-out-of N-level signal on each of said bit lines.

3. The multilevel read only memory of claim 2, which further comprises:

a gating FET transistor connected in series with said bit line on the opposite side of said discharge FET device from said storage FET devices, having a gate connected to a second phase clock waveform following said first phase clock waveform for gating an output signal on said bit line from said storage FET devices during said second phase.

4. The multilevel read only memory of claim 1, which further comprises:

said word line input selectively carrying said second phase clock waveform for turning on said storage FET devices having gates connected thereto;

said bit line connected to the source of the selected storage FET device acquiring a voltage magnitude in response thereto, having a value of said gate voltage minus said predefined threshold voltage as said one-out-of N-level signal.

5. The multilevel read only memory of claim 4, which further comprises:

a one-out-of N-level sense amplifier having an input connected to said bit line for amplifying the voltage magnitude of said one-out-of N-level signal.

6. The multilevel read only memory of claim 5, wherein said sense amplifier further comprises:

a load device connected between said drain potential and an output node;

first, second, third to (N-1) active FET devices having their drains connected to said output node, the gates connected in common to said bit line, and their sources connected to (N-1) different source potentials;

said first active FET device having a threshold voltage less than said second active FET device which has a threshold voltage less than said third active FET device, which has a threshold voltage less than said (N-1) active FET device;

the source potential for said first active FET device being greater than the source potential for said second FET device which is greater than the source potential for said third active FET device, which is greater than the source potential for said (N-1) active FET device;

said one-out-of N-level signal input to the gates of said active FET devices undergoing an N-level inversion and amplification at said output node.

7. The multilevel read only circuit of claim 6, which further comprises:

a one-out-of N-level to binary signal converter circuit having an input connected to said output node of said sense amplifier;

whereby said one-out-of N-level signal amplified by said sense amplifier may be converted to a binary signal having the same numerical value as said one-out-of N-level signal.

8. The multilevel read only memory circuit of claim 7, wherein said N-level signal is a four level signal.

9. The multilevel read only circuit of claim 8, wherein said storage FET devices having their threshold adjusted during fabrication by ion-implantation of conductivity enhancing dopant ions into the channel regions thereof.

10. The multilevel read only memory circuit of claim 9, wherein said threshold voltages of said active FET devices in said sense amplifier circuit are adjusted during their fabrication by ion-implantation of conductivity enhancing dopant ions into their channel regions.

*11. In a read-only memory wherein information storage is provided by a field-effect transistor, the improvement comprising: the transistor channel having a conductance value selected from $2^n$ possible values ($n>1$) to provide a predetermined electrical output which is characteristic of a particular set of n binary digit values, and means for decoding said electrical output into said set of n binary digit values.*

*12. The improved read-only memory of claim 11 wherein the electrical output is characteristic of one of the possible arrangements of n bits of information, n being greater than 1.*

*13. In a read-only memory comprising a plurality of cells wherein information storage is provided in individual cells by a field-effect transistor, the improvement wherein a cell represents one set of a plurality of sets of n bits of information, $n \geqq 2$, the one set being selected from the $2^n$ arrangement of bits taken n at a time, comprising:*

*the cross-sectional area of the transistor channel being selected from one of $2^n$ preselected values to provide an electrical output corresponding to said one set of n bits;*

*the $2^n$ transistor electrical outputs forming an ordered sequence;*

*sensing means connected to the plurality of cells and selectively activated in response to the transistor electrical outputs for producing an amplified electrical output characteristic of the one field-effect transistor output of the ordered sequence; and*

*logic means driven by the sensing means output for generating said set of n bits corresponding to the transistor output.*

*14. The read-only memory of claim 13 wherein the electrical output is voltage and wherein the sensing means comprises $2^n-1$ sense amplifiers, each having first and second input terminals and an output terminal; the first input terminal of each sense amplifier being maintained at one of a series of reference voltages intermediate the magnitude of the transistor output voltages; and the output voltage of the transistor being applied to the second input terminal for activating the sense amplifier to provide an output voltage when the second input terminal voltage exceeds the first input terminal voltage.*

*15. A read-only memory, comprising:*

*a matrix of memory cells, information storage being provided in individual cells thereof by a field-effect transistor, and each cell representing one set of a plurality of sets of n binary digit values, $n \geqq 2$, said one set of binary digit values being selected from $2^n$ arrangements of bits taken n at a time; and further comprising:*

*the cross-sectional area of the transistor channel being selected from one of $2^n$ preselected values to provide an electrical output representing said one set of n binary digit values;*

*the $2^n$ transistor electrical outputs forming an ordered sequence;*

*sensing means comprising $2^n-1$ sense amplifiers, each sense amplifier having first and second input terminals and an output terminal; the first input terminal of each sense amplifier being maintained at one of a series of reference voltages related to the magnitude of the transistor electrical outputs; and the electrical output of the transistor being applied to the second input terminal for activating the sense amplifier when the second input terminal voltage exceeds the first input terminal voltage to provide a sense amplifier output voltage; and*

*logic means driven by the collective output of the sense amplifiers for generating said set of n binary digit values corresponding to the transistor output.*

*16. The read-only memory of claim 15, wherein the transistor electrical output is selected from voltage and current.*

*17. A read-only memory array having a plurality of storage locations for storing digital information, comprising:*

*at least a first storage location having a first transistor, the first transistor being capable of conducting a predetermined amount of current; and a second storage location having a second transistor, the second transistor being capable of conducting a greater amount of current than the first transistor to provide at least one storage location with capability of storing digital information which is represented by more than one digital bit.*

*18. The memory array of claim 17 wherein the transistors are field effect transistors each having a gate electrode region.*

*19. The memory array of claim 17 wherein the current conducting capability is controlled by the threshold voltage of the transistors.*

* * * * *